United States Patent

Vorwerk

[11] Patent Number: 5,506,635
[45] Date of Patent: Apr. 9, 1996

[54] SCANNING METHOD FOR JITTERED SIGNALS

[75] Inventor: Thomas Vorwerk, Berlin, Germany

[73] Assignee: Siemens Aktiengesellschaft, München, Germany

[21] Appl. No.: 244,072
[22] PCT Filed: Sep. 9, 1993
[86] PCT No.: PCT/DE93/00845
    § 371 Date: May 16, 1994
    § 102(e) Date: May 16, 1994
[87] PCT Pub. No.: WO94/07148
    PCT Pub. Date: Mar. 31, 1994

[30] Foreign Application Priority Data

Sep. 15, 1992 [DE] Germany ............ 42 30 853.4

[51] Int. Cl.$^6$ .................. G01R 13/34; H04N 5/14; H04N 5/228
[52] U.S. Cl. .................. 348/571; 348/208; 348/466; 324/121 R; 364/487; 327/9; 327/93; 327/163; 327/233
[58] Field of Search .................. 348/208, 718, 348/719; 375/371; 364/571, 487; 315/370; 324/121 R; 360/76; 327/9, 93, 94, 163, 233; H04N 5/14, 5/228

[56] References Cited

U.S. PATENT DOCUMENTS 4,555,765  11/1985  Crooke et al. .............. 364/571
4,694,244   9/1987  Whiteside et al. .......... 324/121 R Primary Examiner—Wendy R. Greening
Assistant Examiner—Andrew B. Christensen
Attorney, Agent, or Firm—Kenyon & Kenyon

[57] ABSTRACT

The present invention relates to a method for sampling an analog, periodic, measured signal, which is subject to a phase jitter. The misread signal is to be detected with a prior event. One measured value is recorded for each individual signal and each successive measured value recording is delayed by a time unit in which each measured value recording takes place in a fixed time grid with a prior event, and in which the point in time of the start of the signal is detected in the time grid and is stored, assigned to the recorded measured value.

2 Claims, 2 Drawing Sheets

SCANNING METHOD FOR JITTERED SIGNALS

BACKGROUND OF THE INVENTION

The present invention relates to a method for sampling an analog, periodically appearing measuring signal having phase jitter, accounting for a prior event.

In ISDN (Integrated Services Digital Network) measurement technology, measurements are made at the so-called SO interface. One of these measurements consists of analyzing certain periodic measuring signals in the form of pulses at this interface.

Measuring is intended to determine the shape of the pulses. With a pulse length of 5 µs for example and a required resolution of approximately 40 ns, the pulses are scanned by a conventional sampling method.

In this method, one measured value per measured signal that appears (i.e., one measured value per pulse) is taken from the periodically appearing measuring signal (pulse). Measured value recording takes place at a first measuring point with triggering at the start of the measured signal. After each measured value is recorded, the time for the next measured value recording is delayed by a time unit that corresponds to the resolution. In this manner, the entire measured signal is gradually acquired.

This delay is accomplished in a known manner with a delay counter which, after each measured value recording, loads the number of previously recorded measuring points or evaluated measuring signals from a measured point counter as a starting value.

The constantly increasing delay is produced by counting down from the starting value. An analog-to-digital converter is triggered each time a count of zero is reached in the delay counter.

The entire measured signal is scanned and digitized by successively sampling the periodic measured signal at sequential measuring points in time.

The delay counter is controlled by a clock having a pulse rate which is determined by the resolution, for example 128 measuring points, within the measuring signal which is 5 µs long (i.e., 40 ns≈5 µs/128).

The measured point counter and the delay counter are controlled by a sequencing control.

According to the provisions of the FTZ 1 TR 230/CCITT recommendation, the measured signal is to be recorded with a prior event of 2.5 µs and an equally large overtravel. As a result, direct triggering in response to the measured signal to be detected is no longer possible.

The measured signal is generated digitally in a so-called ISDN terminal and is affected with a phase jitter. The amount of the phase jitter is much greater than the required measured value resolution.

The goal of the present invention is to provide a method for detecting an analog, periodically appearing measured signal having phase jitter, accounting for a prior event.

SUMMARY OF THE INVENTION

The method of the present invention achieves this goal by:

detecting the start of each measured signal by a trigger signal;

increasing the count of a measured point counter by one for each measured signal that appears;

transferring a new count on the measured point counter to a delay counter;

decrementing the count of the delay counter;

triggering a measured value recording each time the counter reads zero on the delay counter;

providing a signal to the measured point counter for a first time at a point in time which is determined by the start of a prior event in a measured signal to be recorded;

establishing a count at which the trigger signal is generated during the decrementing of the delay counter;

associating the established count on the delay counter with a respective measured value recorded; and storing the associated established count and measured value recorded.

The invention will now be described with reference to an embodiment shown in the drawing.

DETAILED DESCRIPTION

Figure 1:
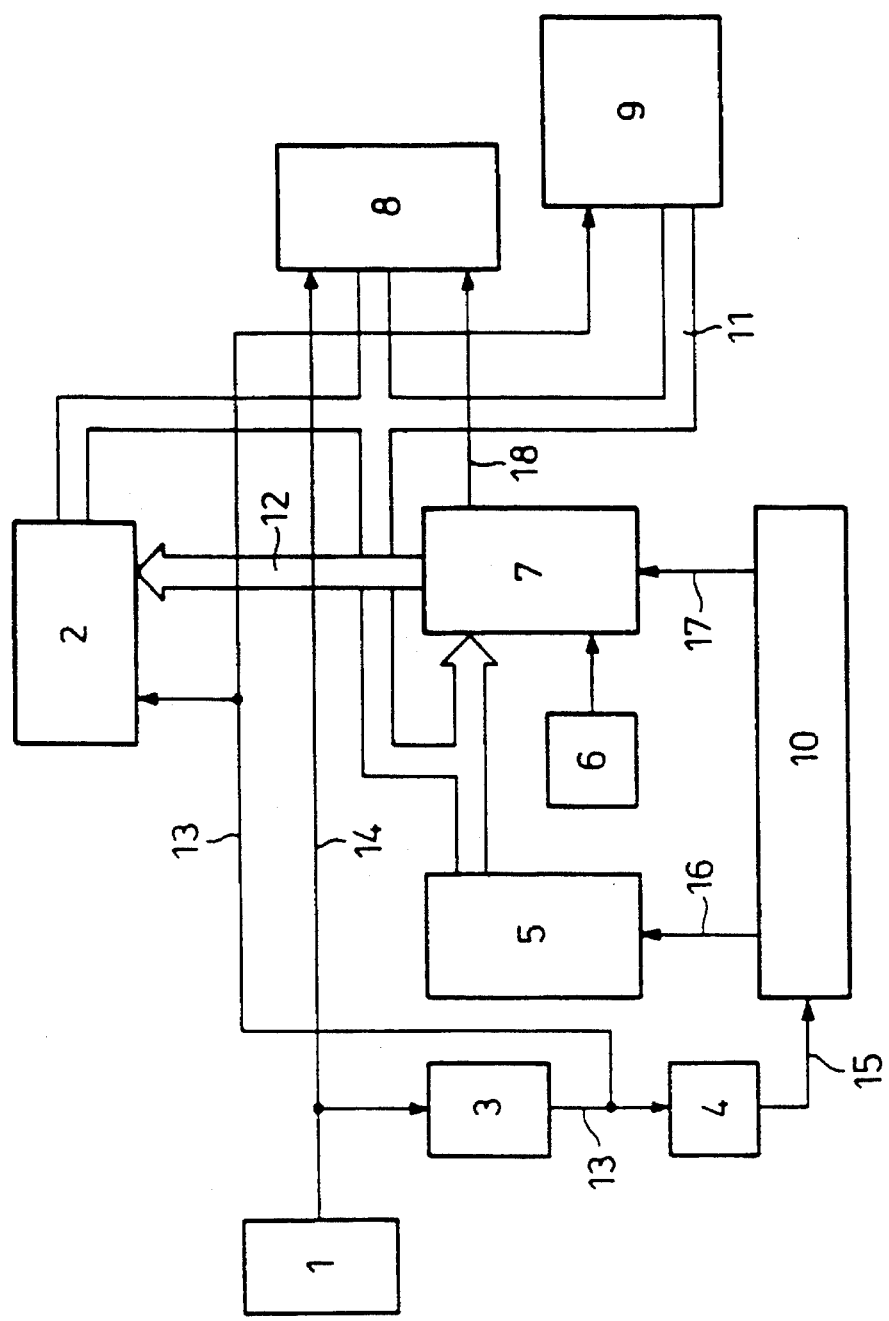
FIG. 1 is a block diagram of a circuit for implementing the method according to the present invention.

FIG. 1 shows the parts of the circuit and connections required for understanding the present invention.

These parts are, specifically, an interface device 1, which delivers a periodically appearing measuring signal through a line 14 to a comparator 3 and a digitizing module 8 with a sample and hold stage and an analog-to-digital converter connected downstream. Comparator 3 delivers a trigger signal through a line 13 to a PLL (i.e., Phase Locked Loop) stage 4, a latch module 2, and a microprocessor 9. The PLL stage 4 sends a measured signal repetition clock pulse through a line 15 to a sequencing control 10.

Sequencing control 10 controls a measured point counter 5 through a control line 16 and controls a delay counter 7 through a control line 17. The counting rate of the delay counter 7 is determined by a connected clock 6.

The output of the count from the measured point counter 5 is applied through a data bus 11 to the input of delay counter 7. The corresponding outputs of latch module 2, of digitizing module 8, and the data bus terminals of microprocessor 9 are coupled with the data bus 11 as well. The outputs for the count from delay counter 7 are connected through a data line 12 to the inputs of latch module 2.

Delay counter 7 delivers a trigger pulse through a line 18 to digitizing module 8.

Figure 2:
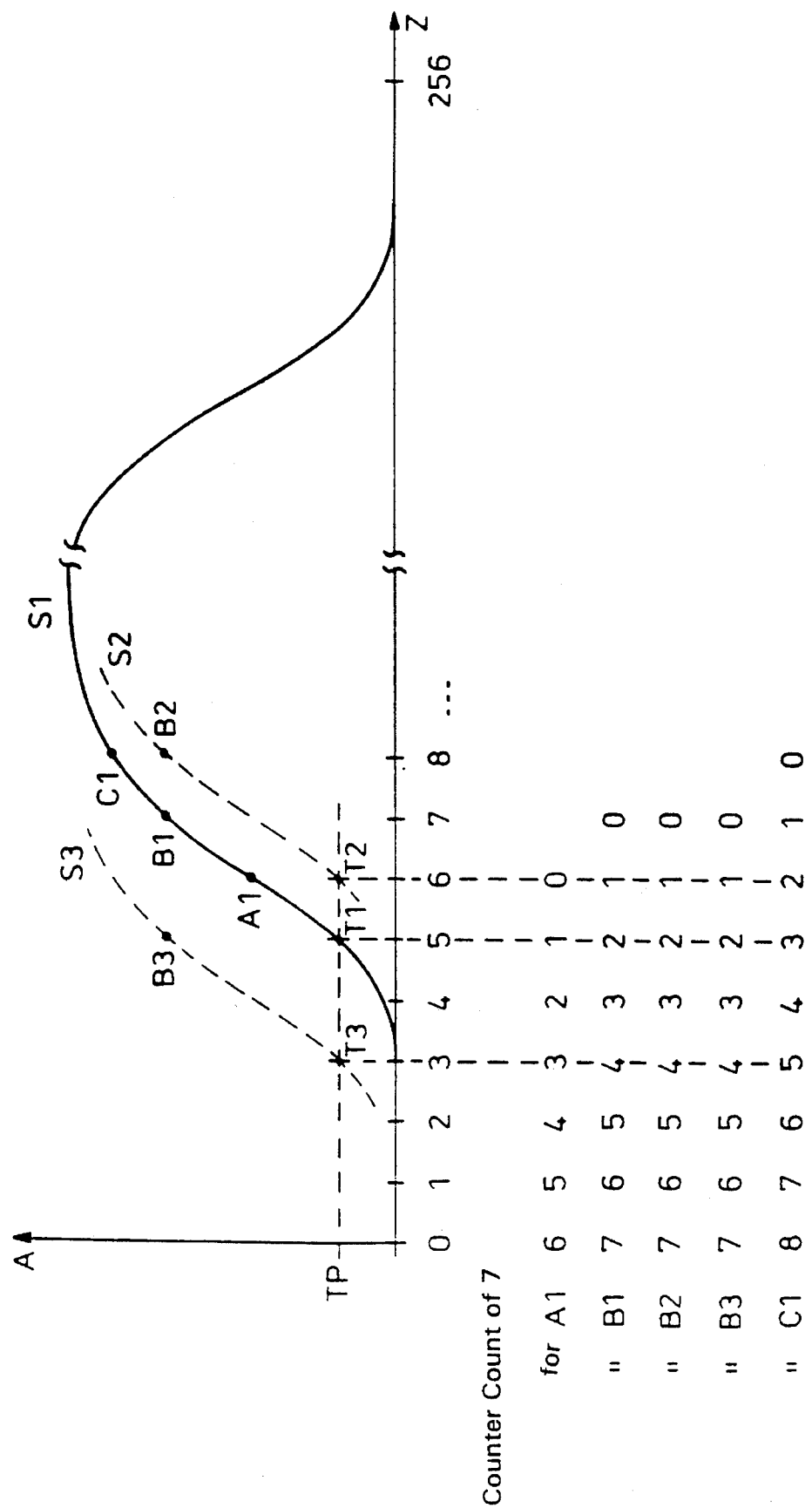
FIG. 2 is a timing diagram which illustrates the method of the present invention.

In FIG. 2, an amplitude A of a measured signal S1, which is assumed to be jitter-free, is plotted against a time slot pattern. The time slot pattern is formed by measuring time points Z with values from 0 to 256. The number and time spacing of measuring time points Z is determined by the duration of measuring signal S1 including the prior event and overtravel and the prescribed resolution. In addition, phase jittered measured signals S2 and S3 are shown, with measured signal S2 lagging in phase relative to measured signal S1 and measured signal S3 leading in phase relative to measured signal S1. In addition, it will be assumed in the following description that the measured signal S1 with a measured value of A1 is followed either by measured signal S2 or measured signal S3. Measured signal S1 has three measured points A1, B1, and C1 measured signal S2 has a measured point B2, and measured signal S3 has a measured point B3.

A trigger level TP with a predetermined amplitude as well as its trigger points T1 to T3, i.e., its intersections with measured signals S1 to S3, are shown.

In the following description of the present invention, FIGS. 1 and 2 are referred to.

Measured signals S1 to S3 are sampled. Measured signals S1 to S3 are delivered by interface device 1 on line 14 to digitizing module 8. This digitizing module 8 contains a sample and hold stage as well as an analog-to-digital converter downstream (neither shown in greater detail) for digitizing the applied signals.

Measured signals S1 to S3 are applied to comparator 3, which delivers a trigger signal to line 13 when measured signals S1 to S3 exceed trigger level TP.

The trigger signal on line 13 is applied to PLL stage 4 which, because of the periodically appearing measured signals S1 to S3, forms a measured signal repetition clock pulse from the trigger signal and delivers it to the sequencing control 10 through line 15. The phase of the measured signal repetition clock pulse leads the measured signals S1 to S3 to be detected by the duration of the desired prior event.

The method according to the present invention can also function without PLL stage 4, if the basic system clock frequency is known. In such a case, it is important to ensure a correct phase angle for this basic frequency, so that the required prior event can be recorded as well. A phase shifter can be used for this purpose.

One measured value per individual signal period is taken from each periodically appearing measured signal S1 in a known manner. After each measured value is recorded, recording of the following measured value from the next measured signal that appears is delayed by a time unit that corresponds to the resolution. As a result, the entire periodically appearing measured signal S1 is gradually sampled. The term "measured value" here refers to the digital value of a measured point on one of measured signals S1 to S3 at one of the measured time points Z of the time slot pattern.

The required delay to record the measured value of the respective successive individual measured signal is accomplished by delay counter 7 which, after each measured point is recorded, loads the number of measured points recorded thus far from measured point counter 5. The count on measured point counter 5 is increased by a value of one after each measured point is recorded. The constantly increasing delay and hence the recording of each successive measured point is accomplished by counting down on delay counter 7.

When a count of zero is reached (reverse overflow), a trigger pulse is delivered to digitizing module 8 by delay counter 7 through line 18. The pulse at this measuring time point Z digitizes the value of the applied measured signal and delivers the associated value to data bus 11.

The start of the delay counter 7 is always triggered by the phase-locked measured signal repetition clock pulse delivered by PLL stage 4 on line 15 through sequencing control 10. The recording of a subsequent measured point (in the following period of measured signal S1) is thus increased by the delay time, 42 ns for example. Delay counter 7 is cycled by clock 6 with the time unit of 42 ns for example. Clock 6 determines the resolution of the measured curve recording, i.e., the time intervals between the successive measured points.

According to the present invention, triggering is used by the measured signal itself in order to determine at this point in time the count on delay counter 7 and hence the time position of the respective measured signal. As each measured point is recorded at measuring time points Z, the point in time of trigger point T1 (or T2 and T3) of measured signal S1 (or S2 and S3) is determined within a time slot pattern.

In the following description, special reference will be made to the table in FIG. 2, in which the count of delay counter 7 is plotted for measured points A1, B1, B2, B3, and C1 as a function of measured time points Z.

When measured value A1 of measured signal S1 is recorded, the count obtained from measured point counter 5 is loaded into delay counter 7 with a value of 6. (This is the measured point at measuring time point Z=6, beginning with the first the first measured point at measuring time point Z=0 with the value of zero in measured point counter 5). The count is transmitted for example through data bus 11. An additional connection can also be provided.

The count on delay counter 7 is reduced by 1 at each of the measuring time points Z until, at a value of zero, digitization by digitizing module 8 takes place.

In addition, the beginning of measured signal S1 is recorded. For this purpose, trigger point T1, i.e. amplitude A of measured signal S1 exceeds trigger level TP is determined in comparator 3. Comparator 3 delivers the trigger signal through line 13, through which the count (in this case a value of one) of delay counter 7 is transferred at this point in time to latch module 2. The trigger signal is also applied to microprocessor 9, so that this count, which corresponds to the point in time of the start of the signal in the time slot pattern of measured time points Z, can be stored together with the measured value of measured point A1 which is recorded next.

During recording of the next measured point B1 of a subsequent, first additional unjittered measured signal S1, a count of 7 is loaded into delay counter 7. At a value of zero in delay counter 7, measured value recording by digitizing module 8 occurs again. At trigger point T1 of this additional measured signal S1, the value 2 is transferred to latch module 2.

During recording of the next measured point C1 of a successive second additional unjittered measured signal S1, the value 8 is loaded into delay counter 7. At a value of zero in delay counter 7, the measured value is recorded by digitizing module 8. At trigger point T1 the value 3 is transferred to latch module 2.

Measured points A1, B1, and C1 occur as measured signals S1, assumed to be jitter-free. Measured points B2 and B3 are applied to measured signals S2 and S3 which are affected by a phase jitter.

During the recording of measured point B2 of a measuring signal S2 with a phase jitter instead of the subsequent first additional unjittered measuring signal S1 causing a phase lagging, as in the case of measured B1, the value 7 is loaded into delay counter 7.

With a value of zero in delay counter 7, the measured value is recorded. Measured signal S2 has trigger point T2 at which the value 1 is transferred from the delay counter 7 to latch module 2. (Compare the case of the measured point B1 of S1 in which the value 2 was transferred from the delay counter 7 to the latch module 2).

During the recording of measured point B3 of the measuring signal S3 with a phase jitter causing a phase jitter causing a phase leading measurement instead of the subsequent first additional unjittered measuring signal S1, as in the case of measured point B1, the value 7 is loaded into delay counter 7. At a value of zero in delay counter 7, measured value recording takes place once again. The measured signal S3 has a trigger point T3 at which value 4 is transferred from the delay counter 7 to latch module 2. (Compare the case of the measured point B1 of S1 in which the value 2 was transferred from the delay counter 7 to the latch module 2).

Measured point B2 of measured signal S2, depending on the point in time that its measured value was recorded, corresponds to the measured point B1 of measured signal S1. Because the "time value" (1 for B2 of S2 and 2 for B1 of S1) is also stored for the respective signal beginning, i.e. trigger point T1 or T2, a subsequent resorting of the measured values is possible. The same is true of measured point B3 of measured signal S3.

With jittered measured signals, during one pass probably not all of the measured points belonging to the time slot pattern are detected, since as a result of the jitter, whose degree can vary depending on the measured point, some measured points are detected several times and others are omitted. This can be compensated by reporting over several measuring cycles.

I claim:

1. A method for detecting a periodically occurring analog signal having phase jitter, comprising the steps of:

a) establishing an initial measured point count at a point in time which is determined by the start of a prior event in said analog signal;

b) detecting, at a point near its beginning, the occurrence of said analog signal and generating a trigger signal in response thereto;

c) setting a delayed count equal to said measured point count;

d) increasing said measured point count by one for each occurrence of said signal;

e) decrementing said delay count at a fixed rate;

f) sampling and recording the value of said analog signal when said delay count reaches zero;

g) recording the value of the delay count at the time of occurrence of said trigger signal;

h) associating the recorded delay count with said sampled and recorded value;

i) storing said associated recorded delay count and said sampled and recorded measured values; and j) repeating steps b) to i) a sufficient number of times to obtain sample values over a measurement cycle encompassing the entire analog signal.

2. The method according to claim 1 and further including repeating the steps of claim 1 over several measurement cycles.

* * * * *